(12) United States Patent
Matsumoto et al.

(10) Patent No.: US 7,471,045 B2
(45) Date of Patent: Dec. 30, 2008

(54) MICROWAVE GENERATOR

(75) Inventors: Hiroshi Matsumoto, Kyoto (JP); Naoki Shinohara, Kyoto (JP)

(73) Assignee: Kyoto University, Kyoto-shi, Kyoto (JP)

( * ) Notice: Subject to any disclaimer, the term of this patent is extended or adjusted under 35 U.S.C. 154(b) by 390 days.

(21) Appl. No.: 10/574,978

(22) PCT Filed: Oct. 6, 2004

(86) PCT No.: PCT/JP2004/014738

§ 371 (c)(1),
(2), (4) Date: Jul. 13, 2006

(87) PCT Pub. No.: WO2005/036730

PCT Pub. Date: Apr. 21, 2005

(65) Prior Publication Data

US 2007/0040510 A1 Feb. 22, 2007

(30) Foreign Application Priority Data

Oct. 9, 2003 (JP) .............................. 2003-350463

(51) Int. Cl.
*H01J 25/50* (2006.01)

(52) U.S. Cl. ................. 315/39.51; 315/39.63

(58) Field of Classification Search .................. 315/39, 315/39.3, 39.53, 39.57, 39.77, 39.51, 39.55, 315/39.63
See application file for complete search history.

(56) References Cited

U.S. PATENT DOCUMENTS 4,224,576 A * 9/1980 Granatstein et al. ............. 330/4
5,635,798 A * 6/1997 Ogura et al. .............. 315/39.71

FOREIGN PATENT DOCUMENTS

| JP | 51-124844 A | 10/1976 |
|----|-------------|---------|
| JP | S60-123110 | 7/1985 |
| JP | 1-159994 A | 6/1989 |
| JP | 2002-043848 | 2/2002 |
| JP | 2002-43848 A | 2/2002 |

OTHER PUBLICATIONS

International Search Report of PCT/JP2004/014738, mailed Dec. 28, 2004.
Matsumoto et al., New microwave tubes requirements for future SPS In: Vacuum Electronics, 2003 4th IEEE International Conference, May 28-30, 2003, pp. 6-7.

* cited by examiner

*Primary Examiner*—David Hung Vu
(74) *Attorney, Agent, or Firm*—Nixon & Vanderhye P.C.

(57) ABSTRACT

A microwave generator comprises a magnetron having an anode and a cathode, oscillating by the current supplied to the anode, and generating a microwave, electric-field controlling means for controlling one of the frequency/phase and the amplitude of the microwave by varying the electric field, and magnetic-field varying means for stabilizing the other by varying the magnetic field.

3 Claims, 6 Drawing Sheets

MICROWAVE GENERATOR

This application is the U.S. national phase of international application PCT/JP2004/014738, filed 6 Oct. 2004, which designated the U.S. and claims priority of JP 2003-350463, filed 9 Oct. 2003, the entire contents of each of which are hereby incorporated by reference.

TECHNICAL FIELD

The present invention relates to a microwave generating apparatus with a magnetron as an oscillating source.

BACKGROUND ART

As such a microwave generating apparatus, mainly used as a heating apparatus, an apparatus in which a coil is formed around the magnet portion of a magnetron for consumer use, and control of the frequency/phase of a microwave oscillated from the magnetron, is realized by combining control of a magnetic field strength and injection locking (e.g. refer to a patent document 1), and an apparatus in which control of the frequency/phase of a microwave oscillated from the magnetron, is realized by combining phase-locked loop (PLL) with respect to the power supply of the magnetron for commercial use and injection locking (e.g. refer to a patent document 2) are proposed.

Patent document 1: Japanese Patent Application Laying Open NO. Sho 60-123110

Patent document 2: Japanese Patent Application Laying Open NO. 2002-43848

However, in the conventional microwave generating apparatus, as described in the patent documents 1 and 2, a desired characteristic can be obtained with regard to the control of the frequency/amplitude of the microwave; however, it is difficult to control the amplitude of the microwave. Thus, this apparatus is applied only to a heating apparatus. Therefore, in the present circumstances, the conventional microwave generating apparatus cannot be applied to a plasma generating apparatus, a communicating apparatus, a radar apparatus, or the like, in which it is necessary to stabilize or control the amplitude of the microwave of the magnetron, simultaneously with the stabilization or control of the frequency/phase of the microwave of the magnetron.

DISCLOSURE OF INVENTION

OBJECT TO BE SOLVED BY THE INVENTION

It is therefore an object of the present invention to provide a microwave generating apparatus which can stabilize or control the amplitude of the microwave of the magnetron, simultaneously with the stabilization or control of the frequency/phase of the microwave of the magnetron.

A microwave generating apparatus of the present invention is provided with:

a magnetron having an anode and a cathode and oscillating by an electric current supplied to the anode, to thereby generate a microwave;

an electric-field controlling device for controlling at least one of a frequency/phase and an amplitude of the microwave, by changing an electric field; and a magnetic-field changing device for stabilizing another of the frequency/phase and the amplitude of the microwave, by changing a magnetic field.

Another microwave generating apparatus of the present invention is provided with:

a magnetron having an anode and a cathode and oscillating by an electric current supplied to the anode, to thereby generate a microwave;

an electric-field controlling device for controlling at least one of a frequency/phase and an amplitude of the microwave, by changing an electric field; and a magnetic-field controlling device for controlling another of the frequency/phase and the amplitude of the microwave, by changing a magnetic field.

According to the microwave generating apparatus of the present invention, at least one of (i) the frequency/phase (i.e., frequency and/or phase) and (ii) the amplitude of the microwave is controlled by changing the electric field, and the other of the frequency/phase and the amplitude of the microwave is stabilized by changing the magnetic field. By this, it is possible to control at least one of the frequency/phase and the amplitude of the microwave, and simultaneously with this, it is possible to stabilize the other of the frequency/phase and the amplitude of the microwave.

According to the another microwave generating apparatus of the present invention, at least one of the frequency/phase and the amplitude of the microwave is controlled by changing the electric field, and the other of the frequency/phase and the amplitude of the microwave is controlled by changing the magnetic field. By this, it is possible to simultaneously control the frequency/phase and the amplitude of the microwave.

Incidentally, the term "stabilize or stabilization" means that the frequency/phase and the amplitude of the microwave as well as the output of the microwave generating apparatus are passively changed so as to include them in a predetermined range. The term "control" means that the frequency/phase and the amplitude of the microwave as well as the output of the microwave generating apparatus are actively changed from the exterior.

Preferably, it is further provided with: an injection locking device for controlling the frequency/phase of the microwave, by injecting a reference signal, which has a natural frequency close to a natural oscillation frequency of the magnetron, into the magnetron, drawing an oscillation frequency of the magnetron into the frequency of the reference signal, and locking the oscillation frequency of the magnetron.

BRIEF DESCRIPTION OF DRAWINGS

FIG. 1 is a diagram showing a first embodiment of the microwave generating apparatus of the present invention.

FIG. 2 is a diagram showing a second embodiment of the microwave generating apparatus of the present invention.

FIG. 3 is a diagram showing a third embodiment of the microwave generating apparatus of the present invention.

FIG. 4 is a diagram showing a fourth embodiment of the microwave generating apparatus of the present invention.

BEST MODE FOR CARRYING OUT THE INVENTION

Figure 1:
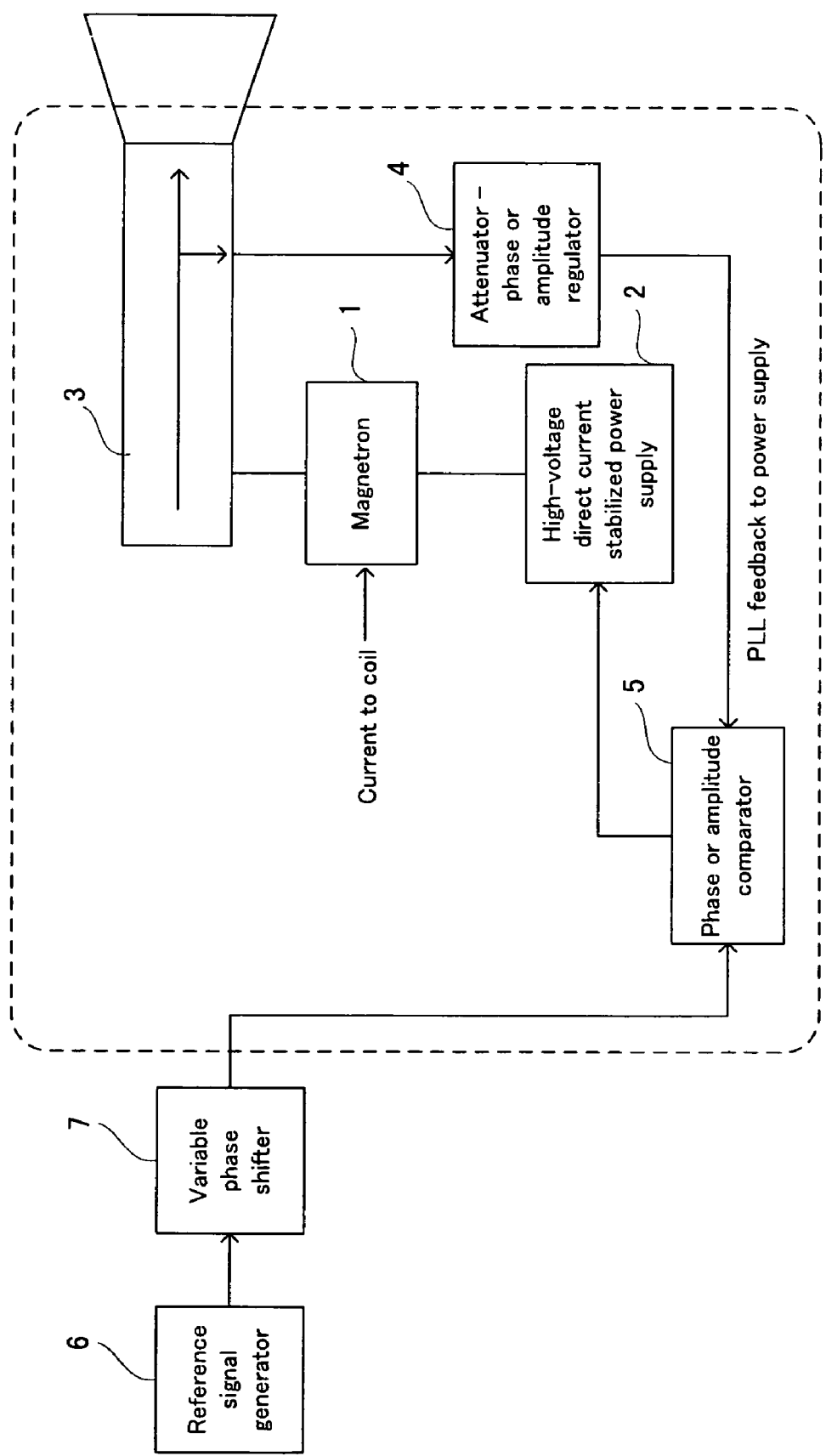
[FIG. 1]

Hereinafter, embodiments of the microwave generating apparatus of the present invention will be discussed in detail, with reference to the drawings. In the drawings, the same constitutional elements carry the same numerical reference.

FIG. 1 is a diagram showing a first embodiment of the microwave generating apparatus of the present invention. This microwave generating apparatus is provided with: a magnetron 1; a high-voltage direct current stabilized power supply 2; a directional coupler 3; an attenuator—phase or amplitude regulator (i.e., "attenuator" and "phase or amplitude regulator") 4; a phase or amplitude comparator 5; a reference signal generator 6; and a variable phase shifter 7.

Between an anode (positive electrode) and a cathode (negative electrode) of the magnetron 1, which are not illustrated, a high-voltage direct current (hereinafter referred to as an "anode current") is flown from the high-voltage direct current stabilized power supply 2. By this, the magnetron 1 is set in an oscillation state. A microwave radiated from the magnetron 1 is outputted to the exterior through the directional coupler 3. For example, it is transmitted to an electric supply system, such as a horn antenna.

The directional coupler 3 divergingly outputs one portion of the microwave output to the attenuator—phase or amplitude regulator 4. The diverged output is attenuated and is phase or amplitude-regulated, and is then supplied to the phase or amplitude comparator 5.

The reference signal generator 6 generates a reference signal which has a frequency close to the natural oscillation frequency of the magnetron 1, and the generated reference signal is supplied to the phase or amplitude comparator 5 through the variable phase shifter 7.

The phase or amplitude comparator 5 compares the microwave with the reference signal, with regard to at least one of the frequency/phase and the amplitude, and changes the anode current such that at least one of the frequency/phase and the amplitude of the microwave matches that of the reference signal, in accordance with a result of the comparison. By this, at least one of the control of the frequency/phase and the stabilization of the amplitude of the microwave is controlled by a change in an electric field.

Along with this, at least the other of the frequency/phase and the amplitude of the microwave is stabilized, due to a passive change in a magnetic field, by manually changing the current of a not-illustrated coil, which is formed around a not-illustrated magnet of the magnetron 1. As a result, according to this embodiment, at least one of the frequency/phase and the amplitude of the microwave is controlled by phase-locked loop (PLL) feedback to the power supply, and simultaneously with this, by changing the current flowing to the coil, the other of the frequency/phase and the amplitude of the microwave can be controlled.

Figure 2:
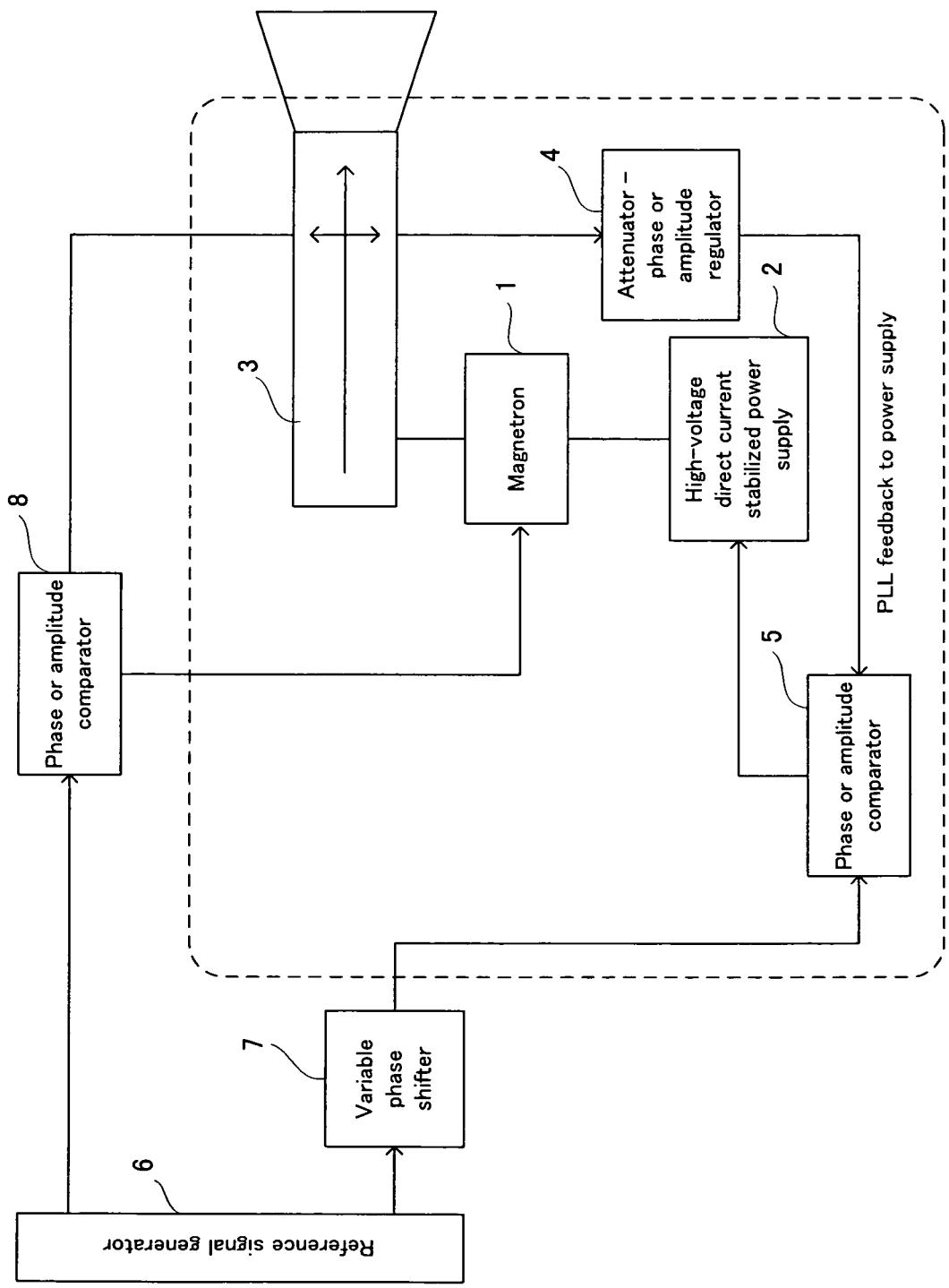
[FIG. 2]

FIG. 2 is a diagram showing a second embodiment of the microwave generating apparatus of the present invention. This microwave generating apparatus is provided with: the magnetron 1; the high-voltage direct current stabilized power supply 2; a directional coupler 3'; the attenuator—phase or amplitude regulator 4; the phase or amplitude comparator 5; the reference signal generator 6; the variable phase shifter 7; and a phase or amplitude comparator 8.

In this embodiment, the directional coupler 3' also divergingly outputs one portion of the microwave output to the phase or amplitude comparator 8, in addition to the attenuator—phase or amplitude regulator 4. The reference signal is also supplied to the phase or amplitude comparator 8. The phase or amplitude comparator 8 compares the microwave with the reference signal, with regard to intensity, and actively changes the current of a not-illustrated coil such that the intensity of the microwave matches that of the reference signal, in accordance with a result of the comparison. By this, at least the other of the control of the frequency/phase and the stabilization of the amplitude of the microwave is controlled by a change in an electric field. By this, it is possible to simultaneously control the frequency/phase and the amplitude of the microwave.

Figure 3:
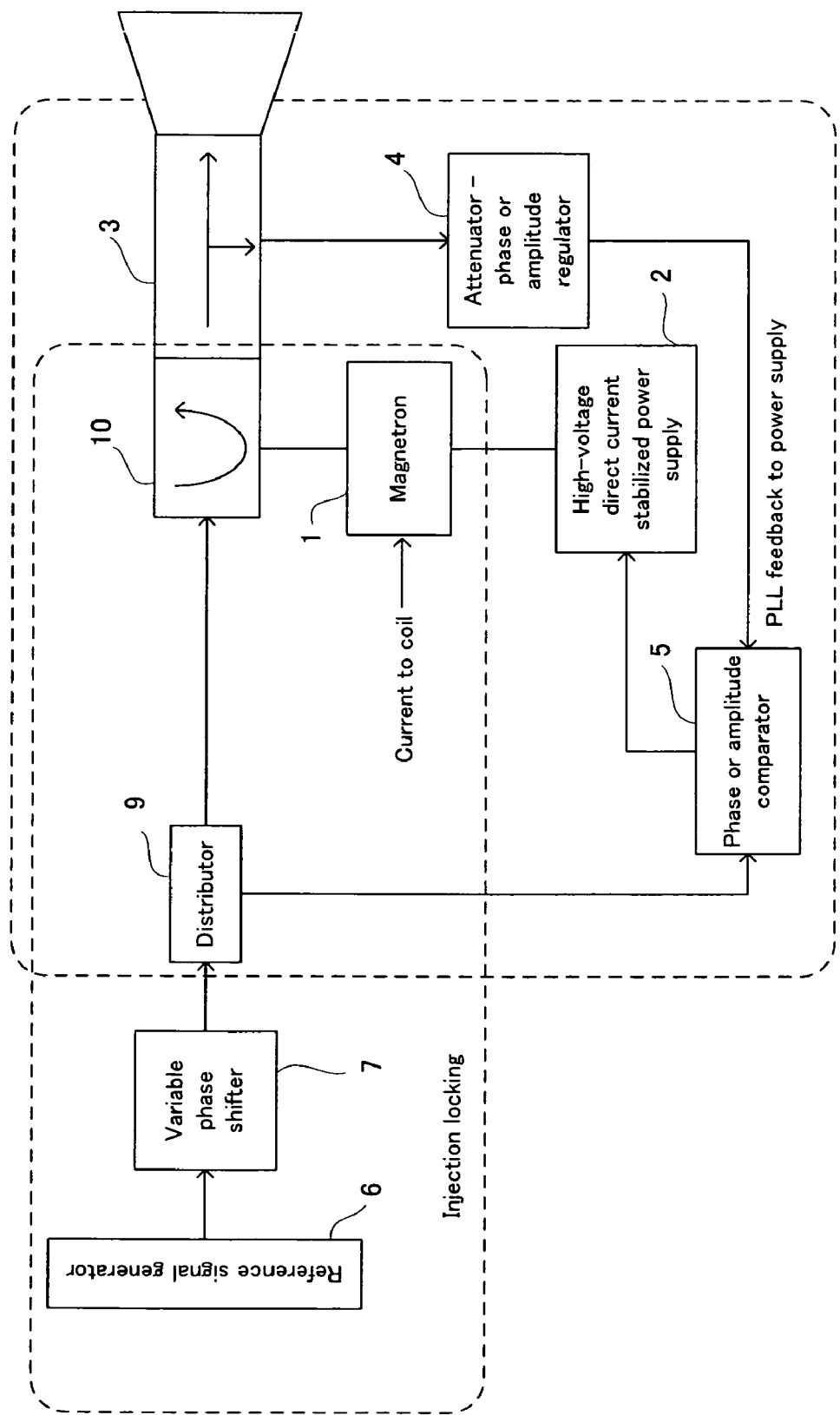
[FIG. 3]

FIG. 3 is a diagram showing a third embodiment of the microwave generating apparatus of the present invention. This microwave generating apparatus is provided with: the magnetron 1; the high-voltage direct current stabilized power supply 2; the directional coupler 3; the attenuator—phase or amplitude regulator 4; the phase or amplitude comparator 5; the reference signal generator 6; the variable phase shifter 7; a distributor 9; and a circulator 10.

In this embodiment, the reference signal is supplied to the distributor 9 through the variable phase shifter 7. The distributor 9 distributes the inputted reference signal into two systems, such that the reference signal in one system is supplied to the circulator 10 and the reference signal in the other system is supplied to the phase or amplitude comparator 5.

In the circulator 10, the reference signal supplied from the distributor 9 is inputted from a first terminal, and the inputted reference signal is outputted from a second terminal, to thereby inject it into the magnetron 1. Then, the microwave radiated from the magnetron 1 is taken into the circulator 10 from the second terminal, and outputted from a third terminal. The microwave outputted from the circulator 10 is outputted to the exterior through the directional coupler 3. For example, it is transmitted to an electric supply system, such as a horn antenna.

In the oscillation state of the magnetron 1, the reference signal, which has a frequency close to the natural oscillation frequency of the magnetron 1 and which is generated on the reference signal generator 6, is injected into the magnetron 1 through the circulator 10. As a result, the oscillation frequency of the magnetron 1 is drawn into the frequency of the reference signal.

The microwave radiated from the magnetron 1 is outputted to the exterior through the circulator 10 and the directional coupler 3. At this time, because of the characteristics that the circulator 10 has, the microwave output does not return to the reference signal input side.

According to this embodiment, at least one of the frequency/phase and the amplitude of the microwave is controlled by the PLL feedback with respect to the power supply, and simultaneously with this, by changing the current flowing to the coil, the other of the frequency/phase and the amplitude of the microwave can be stabilized. Moreover, by virtue of the injection locking, it is possible to draw the oscillation frequency of the magnetron 1 into the frequency of the reference signal, and lock (i.e., achieve synchronization of) the frequency/phase by the feedback control. At this time, the frequency/phase are locked by controlling the anode current of the magnetron 1, so that it is possible to take an extremely broad control range or width, which further improves the stabilization.

Figure 4:
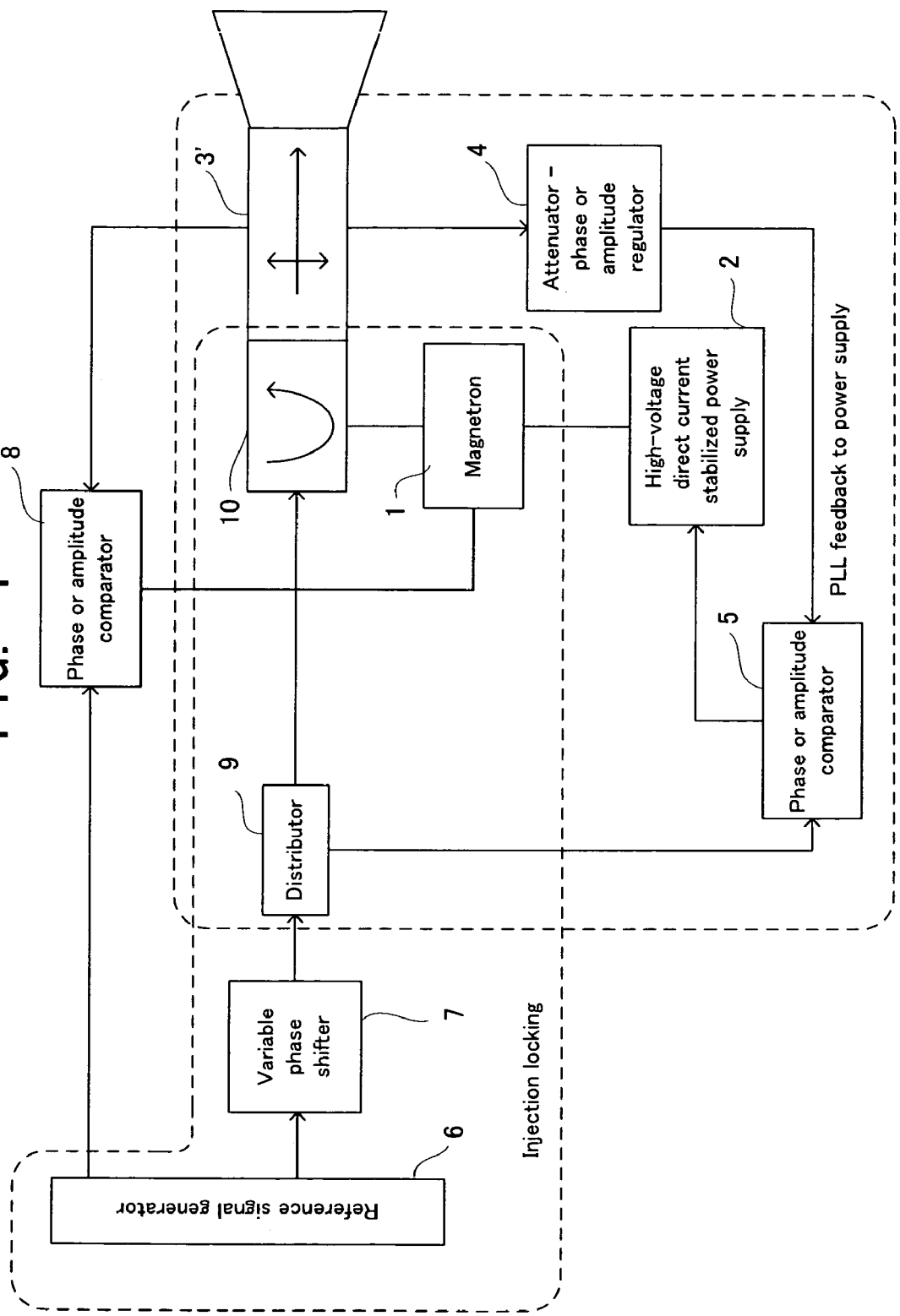
[FIG. 4]

FIG. 4 is a diagram showing a fourth embodiment of the microwave generating apparatus of the present invention. This microwave generating apparatus is provided with: the magnetron 1; the high-voltage direct current stabilized power supply 2; the directional coupler 3; the attenuator—phase or amplitude regulator 4; the phase or amplitude comparator 5; the reference signal generator 6; the variable phase shifter 7; the phase or amplitude comparator 8; the distributor 9; and the circulator 10.

According to this embodiment, it is possible to simultaneously control the frequency/phase and the amplitude of the microwave, and further improve the stabilization.

Figure 5:
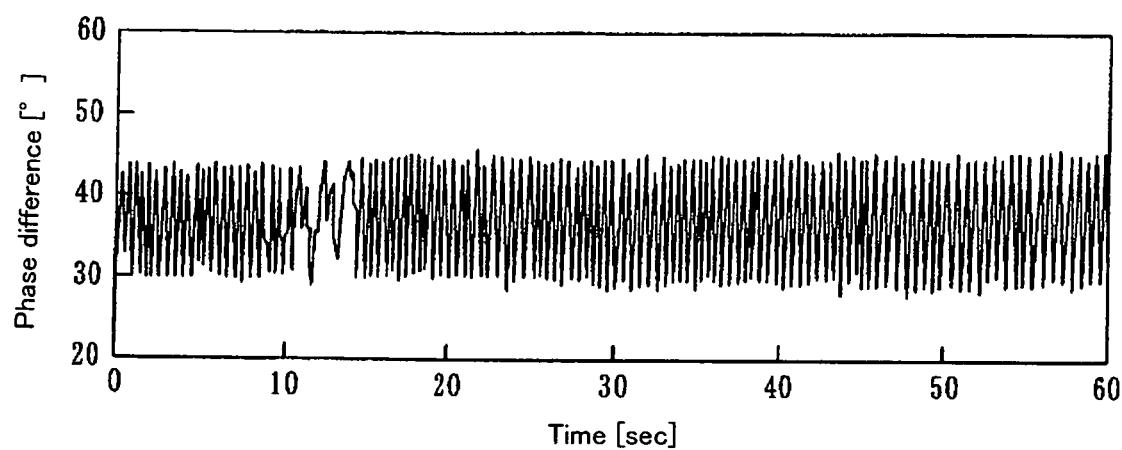
[FIG. 5] FIG. 5 are diagrams showing experimental results in a conventional microwave generating apparatus.
Figure 5:
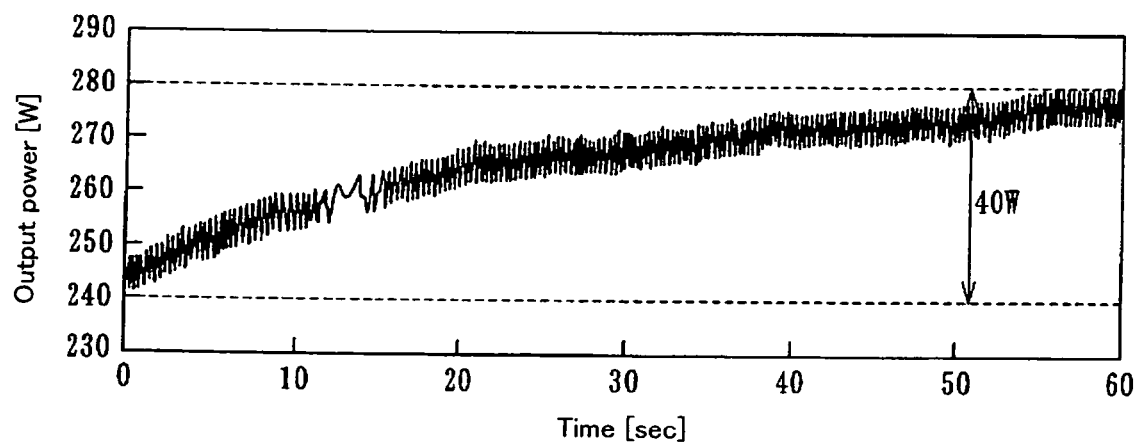
Figure 6:
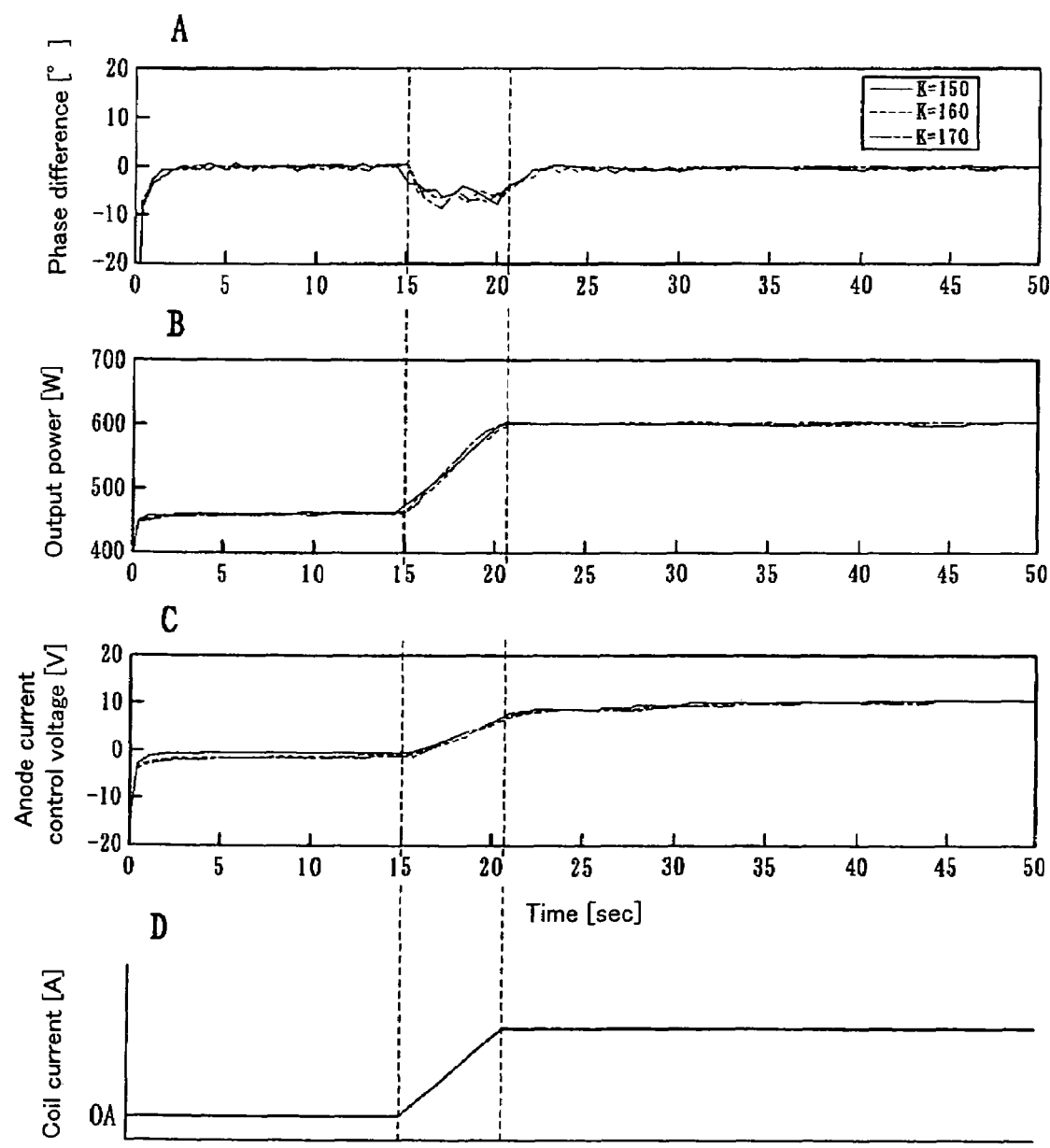
[FIG. 6] FIG. 6 are diagrams showing experimental results in the microwave generating apparatus of the present invention.

FIGS. 5 are diagrams showing experimental results in a conventional microwave generating apparatus. FIGS. 6 are diagrams showing experimental results in the microwave generating apparatus of the present invention. Incidentally, as the conventional microwave generating apparatus, an apparatus which does not change the current of the coil of the magnetron 1 in the microwave generating apparatus shown in FIG. 1 was used. As the microwave generating apparatus of the present invention, the microwave generating apparatus shown in FIG. 3 was used.

In the conventional microwave generating apparatus, it can be seen that even if a phase difference is set within about 10 degrees for 50 seconds as shown in FIG. 5A, an output power changes by about 40 W as shown in FIG. 5B.

As opposed to this, in the microwave generating apparatus of the present invention, it can be seen that even if the current of the coil of the magnetron 1 is increased (FIG. 6D) so as to increase the output power from 450 W to 500 W for 10 to 15 seconds (FIG. 6B), and in response to that, a cathode current control voltage increases from 6.5V to 7V (FIG. 6C), the phase difference is stable in a condition of zero after 25 seconds.

The present invention is not limited to the above-described embodiments, and various changes and modifications can be made. For example, in the above-mentioned embodiments, the electric field is changed by the PLL feedback with respect to the power supply, and the magnetic field is changed by actively or passively changing the current of the coil; however, the change in the electric field and the change in the magnetic field can be performed in other arbitrary methods.

INDUSTRIAL APPLICABILITY

In the present invention, it is possible to stabilize or control the amplitude of the microwave of the magnetron, simultaneously with the stabilization or control of the frequency/phase of the microwave of the magnetron. Thus, it is possible to inexpensively construct not only a heating apparatus but also various apparatuses which use a microwave for communication use or for energy transmission use (e.g. a plasma generating apparatus, a communicating apparatus, and a radar apparatus), in which it is necessary to stabilize or control the amplitude of the microwave of the magnetron, simultaneously with the stabilization or control of the frequency/phase of the microwave of the magnetron.

The invention claimed is:

1. A microwave generating apparatus comprising:
    a magnetron having an anode and a cathode and oscillating by an electric current supplied to the anode, to thereby generate a microwave;
    an electric-field controlling device for controlling at least one of a frequency/phase and an amplitude of the microwave, by changing an electric field; and
    a magnetic-field changing device for stabilizing another of the frequency/phase and the amplitude of the microwave, by changing a magnetic field.

2. A microwave generating apparatus comprising:
    a magnetron having an anode and a cathode and oscillating by an electric current supplied to the anode, to thereby generate a microwave;
    an electric-field controlling device for controlling at least one of a frequency/phase and an amplitude of the microwave, by changing an electric field; and
    a magnetic-field controlling device for controlling another of the frequency/phase and the amplitude of the microwave, by changing a magnetic field.

3. The microwave generating apparatus according to claim 1 or 2, further comprising: an injection locking device for controlling the frequency/phase of the microwave, by injecting a reference signal, which has a natural frequency close to a natural oscillation frequency of said magnetron, into said magnetron, drawing an oscillation frequency of said magnetron into the frequency of the reference signal, and locking the oscillation frequency of said magnetron.

* * * * *